(12) United States Patent
Bai et al.

(10) Patent No.: US 11,980,069 B2
(45) Date of Patent: May 7, 2024

(54) DISPLAY AND DISPLAY DEVICE

(71) Applicant: BOE TECHNOLOGY GROUP CO., LTD., Beijing (CN)

(72) Inventors: Xiao Bai, Beijing (CN); Shengji Yang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 613 days.

(21) Appl. No.: 17/260,250

(22) PCT Filed: Mar. 27, 2020

(86) PCT No.: PCT/CN2020/081874
§ 371 (c)(1),
(2) Date: Jan. 14, 2021

(87) PCT Pub. No.: WO2021/189491
PCT Pub. Date: Sep. 30, 2021

(65) Prior Publication Data
US 2022/0140052 A1    May 5, 2022

(51) Int. Cl.
*H10K 59/131* (2023.01)
*H05K 1/18* (2006.01)
*H10K 77/10* (2023.01)

(52) U.S. Cl.
CPC .......... *H10K 59/131* (2023.02); *H05K 1/189* (2013.01); *H10K 77/111* (2023.02)

(58) Field of Classification Search
CPC ..... H10K 59/131; H10K 77/111; H05K 1/189
(Continued)

(56) References Cited

U.S. PATENT DOCUMENTS 7,897,483 B2    3/2011    Yamazaki et al.
2007/0030433 A1    2/2007    Kudo et al.
(Continued)

FOREIGN PATENT DOCUMENTS

CN    101471349 A    7/2009
CN    201910415 U    7/2011
(Continued)

OTHER PUBLICATIONS

Extended European Search Report for EP Patent Application No. 20900711.1 mailed Apr. 25, 2023.
(Continued)

*Primary Examiner* — Tu-Tu V Ho
(74) *Attorney, Agent, or Firm* — Perilla Knox & Hildebrandt LLP; Kenneth A. Knox

(57) ABSTRACT

A display includes a display substrate and a flexible circuit board. The display substrate includes a silicon substrate, a driving circuit of which at least part is embedded in the silicon substrate, and a first pad electrically connected with the driving circuit. The driving circuit includes a transistor with a semiconductor layer; the flexible circuit board includes a flexible substrate, a first wiring layer, and a first reinforcement plate. The first wiring layer includes a main wiring portion and a second pad electrically connected with the main wiring portion, and the second pad is electrically connected with the first pad by a conductive adhesive layer. The first reinforcement plate covers the main wiring portion and does not cover the second pad. The first reinforcement plate is located outside the display substrate and there is a non-zero distance between the first reinforcement plate and the display substrate.

17 Claims, 5 Drawing Sheets

(58) Field of Classification Search
USPC .......................................................... 257/40
See application file for complete search history.

(56) References Cited

U.S. PATENT DOCUMENTS

| | | |
|---|---|---|
| 2009/0166896 A1 | 7/2009 | Yamazaki et al. |
| 2013/0092930 A1* | 4/2013 | Kimura ................ G09G 3/3233 257/300 |
| 2015/0268775 A1* | 9/2015 | Yu .......................... H10K 59/87 345/173 |
| 2018/0151536 A1 | 5/2018 | Song et al. |
| 2019/0334115 A1 | 10/2019 | Matsuda et al. |
| 2021/0265591 A1 | 4/2021 | Matsuda et al. |
| 2021/0351353 A1 | 11/2021 | Lu et al. |

FOREIGN PATENT DOCUMENTS

| | | |
|---|---|---|
| CN | 105578749 A | 5/2016 |
| CN | 105578749 B | 7/2018 |
| JP | H0317629 A | 1/1991 |
| JP | 2798422 B2 | 9/1998 |
| JP | 2006222336 A | 8/2006 |
| WO | 2019214253 A1 | 11/2019 |

OTHER PUBLICATIONS

Written Opinion for International Application No. PCT/CN2020/081874 mailed Dec. 31, 2020.

\* cited by examiner

DISPLAY AND DISPLAY DEVICE

CROSS-REFERENCE TO RELATED APPLICATION

The present application is a 35 U.S.C. § 371 national phase application of and claims priority to International Application No. PCT/CN2020/081874, filed on Mar. 27, 2020, where the entire contents thereof are incorporated herein by reference.

TECHNICAL FIELD

The present disclosure relates to the field of display technologies and, in particular, to a display and a display device.

BACKGROUND

In recent years, with the increasing progress of Virtual Reality (VR) and Augmented Reality (AR) technologies, display devices suitable for the VR/AR fields are also developing towards miniaturization, high Pixels Per Inch (PPI), quick response, and high color gamut. Silicon-based micro Organic Light-Emitting Diode (OLED) panels are exactly one prominent development direction among them. Although the silicon-based micro OLED technology started relatively late, it is becoming a new focus of attention in the display field by virtue of its advantages of miniaturization and high PPI.

Because Flexible Printed Circuit (FPC) is mainly applied to the AR/VR fields, in order to facilitate module assembly, it becomes a main connection component to connect the silicon-based OLED with the driving terminal. Therefore, higher requirements are put forward for the design of the flexible printed circuit and the laminating process of the flexible printed circuit and the silicon-based OLED.

SUMMARY

In one embodiment of the present disclosure, a display is provided, including:

A display substrate including a silicon substrate, a driving circuit, and a first pad, where at least part of the driving circuit is embedded in the silicon substrate, the driving circuit includes a transistor with a semiconductor layer, the semiconductor layer is located inside the silicon substrate, and the first pad is electrically connected with the driving circuit.

A flexible circuit board including a flexible substrate, a first wiring layer and a first reinforcement plate, the first wiring layer is formed on the flexible substrate, and the first wiring layer includes a main wiring portion and a second pad, the second pad is electrically connected with the main wiring portion and is configured to extend in a direction away from the main wiring portion, and the second pad is electrically connected with the first pad by a conductive adhesive layer; the first reinforcement plate is formed on a side of the first wiring layer away from the flexible substrate; an orthographic projection of the first reinforcement plate on the flexible substrate is configured to cover an orthographic projection of the main wiring portion on the flexible substrate and do not overlap with an orthographic projection of the second pad on the flexible substrate.

In an extension direction of the second pad, the first reinforcement plate is located outside the display substrate and there is a non-zero distance between the first reinforcement plate and the display substrate.

In one exemplary embodiment of the present disclosure, a distance between the first reinforcement plate and the display substrate in the extension direction of the second pad is not less than 200 μm.

In one exemplary embodiment of the present disclosure, the flexible circuit board further includes a second reinforcement plate, the second reinforcement plate is located on a side of the flexible substrate away from the first wiring layer, the second reinforcement plate is configured to have at least a first reinforcement region, and an orthographic projection of the first reinforcement region on the flexible substrate is configured to overlap with the orthographic projection of the second pad on the flexible substrate.

In one exemplary embodiment of the present disclosure, the second reinforcement plate is further configured to have a second reinforcement region, the second reinforcement region and the first reinforcement region are sequentially arranged and connected with each other in the extension direction of the second pad, and an orthographic projection of the second reinforcement region on the flexible substrate is located within the orthographic projection of the first reinforcement plate on the flexible substrate.

In one exemplary embodiment of the present disclosure, a size of the second reinforcement region in the extension direction of the second pad is not less than 500 μm.

In one exemplary embodiment of the present disclosure, the first reinforcement region and the second reinforcement region are integrally formed.

In one exemplary embodiment of the present disclosure, the flexible circuit board further includes a second wiring layer and a third reinforcement plate, the second wiring layer is located on the side of the flexible substrate away from the first wiring layer and is electrically connected with the main wiring portion through a via hole; the third reinforcement plate is formed on a side of the second wiring layer away from the flexible substrate.

An orthographic projection of the second wiring layer on the flexible substrate is located within the orthographic projection of the first reinforcement plate on the flexible substrate, and is located within a orthographic projection of the third reinforcement plate on the flexible substrate.

In one exemplary embodiment of the present disclosure, there are a plurality of via holes.

In one exemplary embodiment of the present disclosure, a fracture is provided between the third reinforcement plate and the second reinforcement region.

In one exemplary embodiment of the present disclosure, the third reinforcement plate is configured to cover one side of the second wiring layer facing the second reinforcement region.

In one exemplary embodiment of the present disclosure, the conductive adhesive layer is made from an anisotropic conductive adhesive.

In one exemplary embodiment of the present disclosure, the display substrate is configured to have a display region and a bonding region located at at least one side of the display region, and the first pad is located in the bonding region.

The display substrate further includes a light-emitting element located in the display region, and the light-emitting element is formed at a side of the driving circuit away from a base substrate and is electrically connected with the driving circuit.

In one embodiment of the present disclosure, a display is provided, including:

A display substrate including a silicon substrate, a driving circuit and a first pad, at least part of the driving circuit is embedded in the silicon substrate, the driving circuit includes a transistor with a semiconductor layer, the semiconductor layer is located inside the silicon substrate, and the first pad is electrically connected with the driving circuit.

A flexible circuit board including a flexible substrate and a first wiring layer formed on the flexible substrate, and the first wiring layer includes a main wiring portion and a second pad, the second pad is electrically connected with the main wiring portion and is configured to extend in a direction away from the main wiring portion, and the second pad is electrically connected with the first pad by a conductive adhesive layer.

The conductive adhesive layer is configured to cover the first pad and an edge area of the display substrate close to the main wiring portion.

In one exemplary embodiment of the present disclosure, the conductive adhesive layer is configured to extend in a direction close to the main wiring portion and protrude out of a boundary of the display substrate, and a size of a part of the conductive adhesive layer protruding out of the boundary of the display substrate is not less than 200 µm.

In one exemplary embodiment of the present disclosure, the flexible circuit board further includes a first reinforcement plate and a second reinforcement plate.

The first reinforcement plate is formed at a side of the first wiring layer away from the flexible substrate, an orthographic projection of the first reinforcement plate on the flexible substrate is configured to cover an orthographic projection of the main wiring portion on the flexible substrate and do not overlap with an orthographic projection of the second pad on the flexible substrate.

The second reinforcement plate is located at a side of the flexible substrate away from the first wiring layer, the second reinforcement plate is configured to have a first reinforcement region and a second reinforcement region, and an orthographic projection of the first reinforcement region on the flexible substrate is configured to overlap with the orthographic projection of the second pad on the flexible substrate; the second reinforcement region and the first reinforcement region are sequentially arranged and connected with each other in an extension direction of the second pad, and an orthographic projection of the second reinforcement region on the flexible substrate is located within the orthographic projection of the first reinforcement plate on the flexible substrate.

In one exemplary embodiment of the present disclosure, a size of the second reinforcement region in the extension direction of the second pad is not less than 500 µm.

In one embodiment of the present disclosure, a display device is provided, wherein the display device includes any one of the displays as described above.

BRIEF DESCRIPTION OF THE DRAWINGS

The accompanying drawings are used to provide a further understanding of embodiments of the present disclosure and to constitute a part of the specification, and are used to explain the present disclosure together with the embodiments of the present disclosure and do not constitute a limitation of the present disclosure. The above and other features and advantages will become more apparent to those skilled in the art by describing the detailed exemplary embodiments with reference to the accompanying drawings, in which.

DETAILED DESCRIPTION

Technique solutions of the present disclosure will be described in detail hereinafter by exemplary embodiments in combination with the drawings. In the specification, same or similar component (s) is/are indicated by same or similar reference number (s). Following description of the embodiments of the present disclosure with reference to the drawings intends to describe general concepts of the present disclosure and should not be understood to limit the present disclosure.

In addition, in the following detailed description, many specific details are set forth to provide a comprehensive understanding of the embodiments of the present disclosure for ease of presentation. However, it is obvious that one or more embodiments may be implemented without these details.

It should be noted that in this description, expressions "on . . . ", "formed on . . . ", and "disposed on . . . " may indicate that one layer is directly formed or disposed on another layer, or may indicate that one layer is indirectly formed or disposed on another layer, that is, there is(are) other layer(s) between the two layers.

The terms "a", "one", "the", "said" and "at least one" are used to express the presence of one or more elements/components/etc.; the terms "include/comprise" and "have" are intended to be inclusive, and mean there may be additional elements/components/etc. other than the listed elements/components/etc.

It should be noted that terms "first", "second", "third", etc. may here be used to describe various components, members, elements, regions, layers and/or portions, however, these components, members, elements, regions, layers and/or portions should not be limited by these terms. Instead, these terms are used to distinguish one of these components, members, elements, regions, layers and/or portions from another.

Figure 1A:
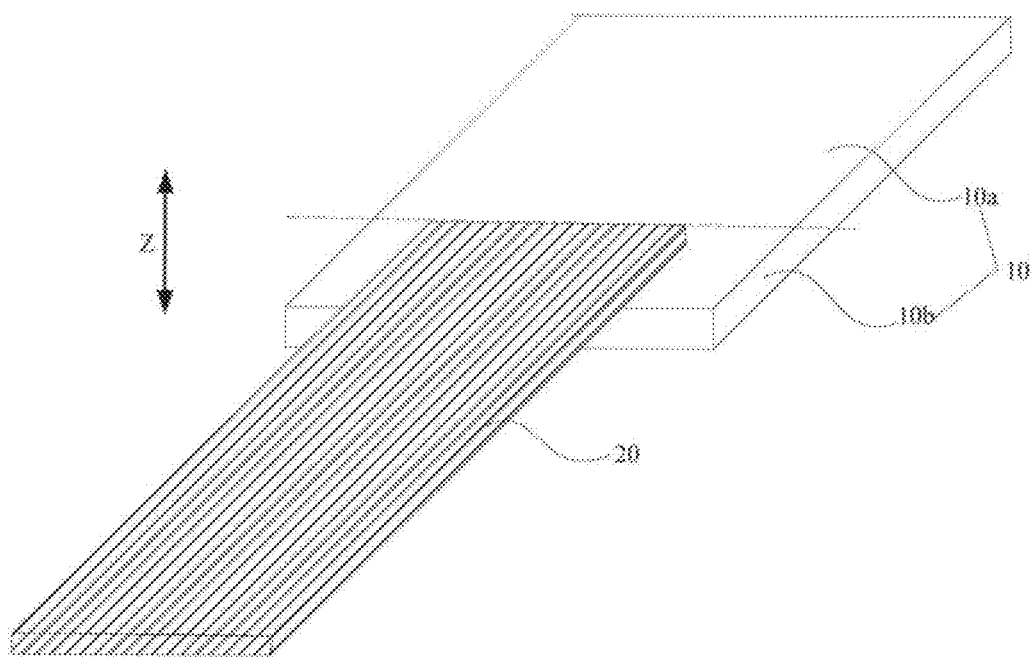
FIG. 1a is a schematic assembly diagram of a display substrate and a flexible circuit board shown in an embodiment of the present disclosure.
Figure 1B:
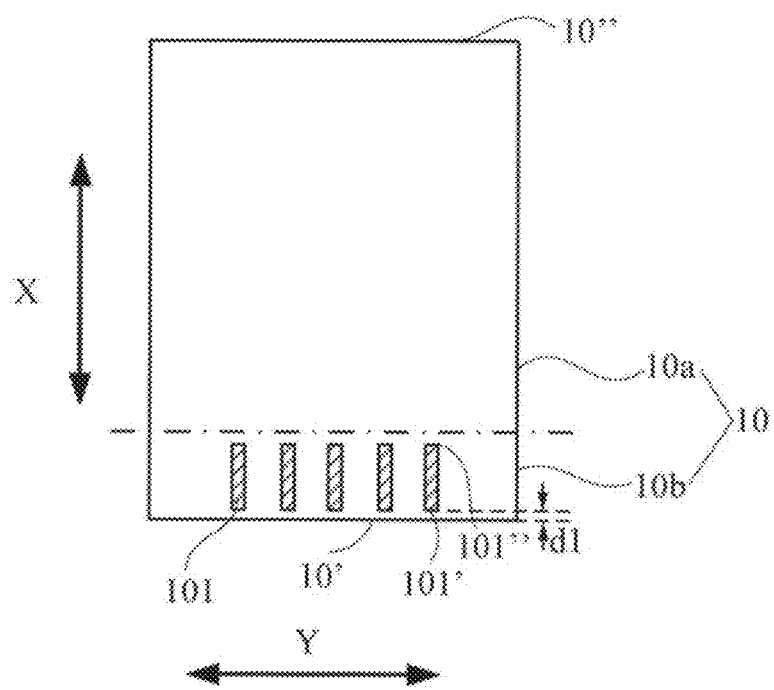
FIG. 1b is a schematic top view of a display substrate shown in an embodiment of the present disclosure.
Figure 1C:
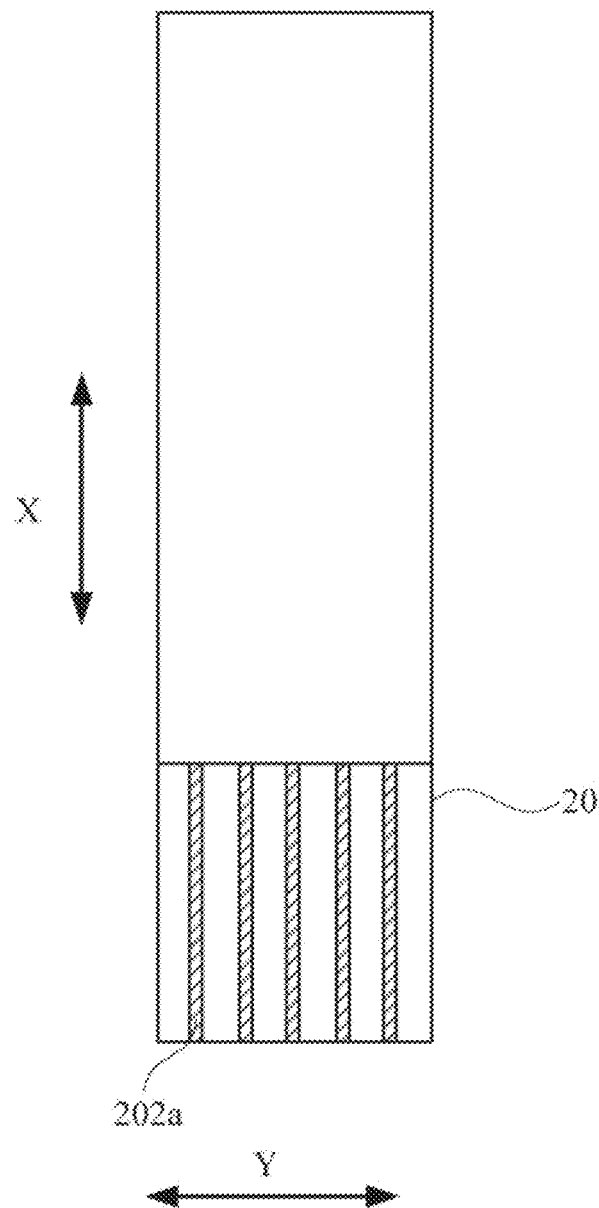
FIG. 1c is a schematic bottom view of a flexible circuit board shown in an embodiment of the present disclosure.

As shown in FIGS. 1a to 1c, an embodiment of the present disclosure provides a display, which may include a display substrate 10 and a flexible circuit board 20.

Figure 3A:
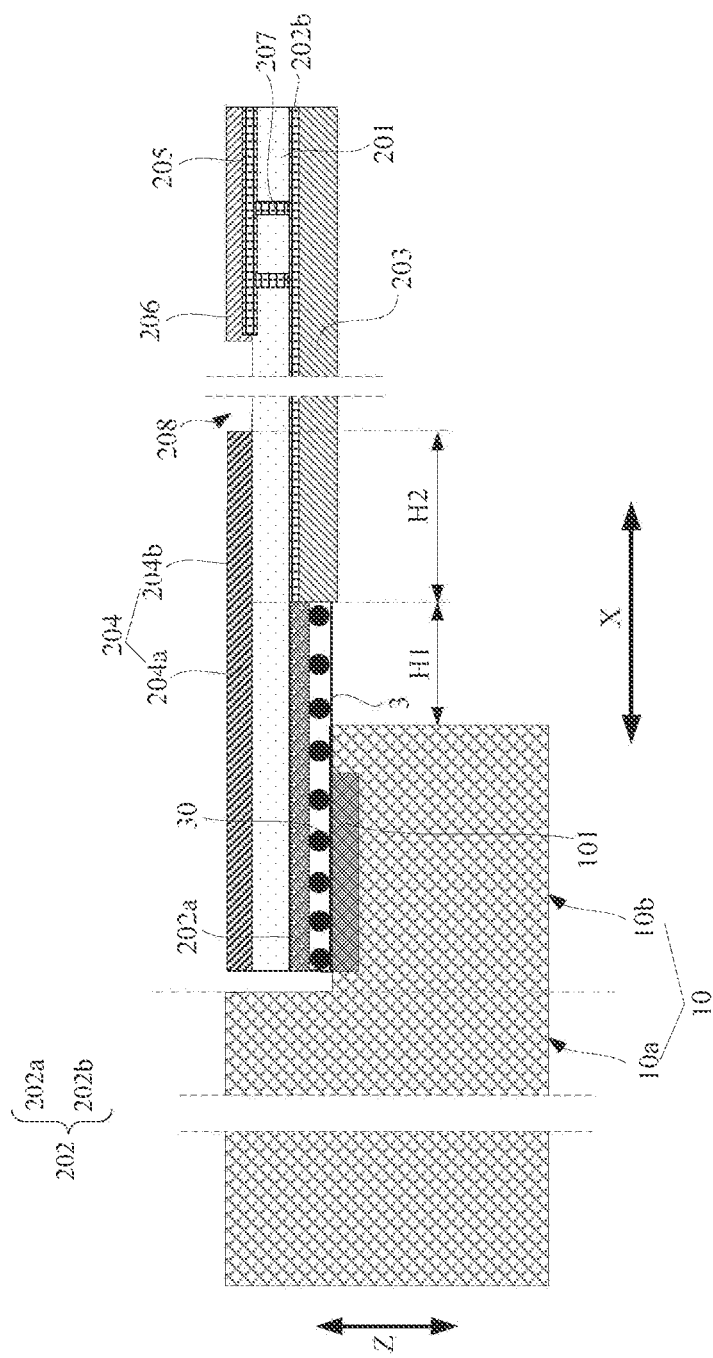
FIGS. 3a and 3b are schematic cross-sectional views of a display shown in an embodiment of the present disclosure.
Figure 3B:
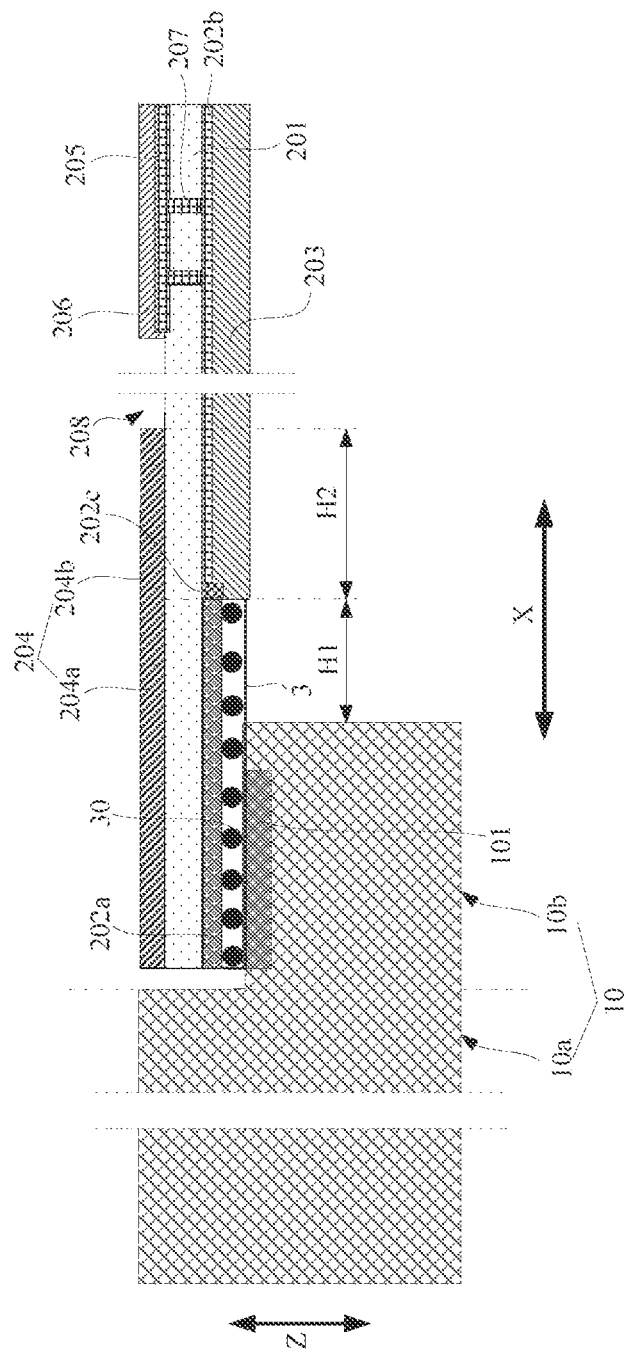
Figure 4:
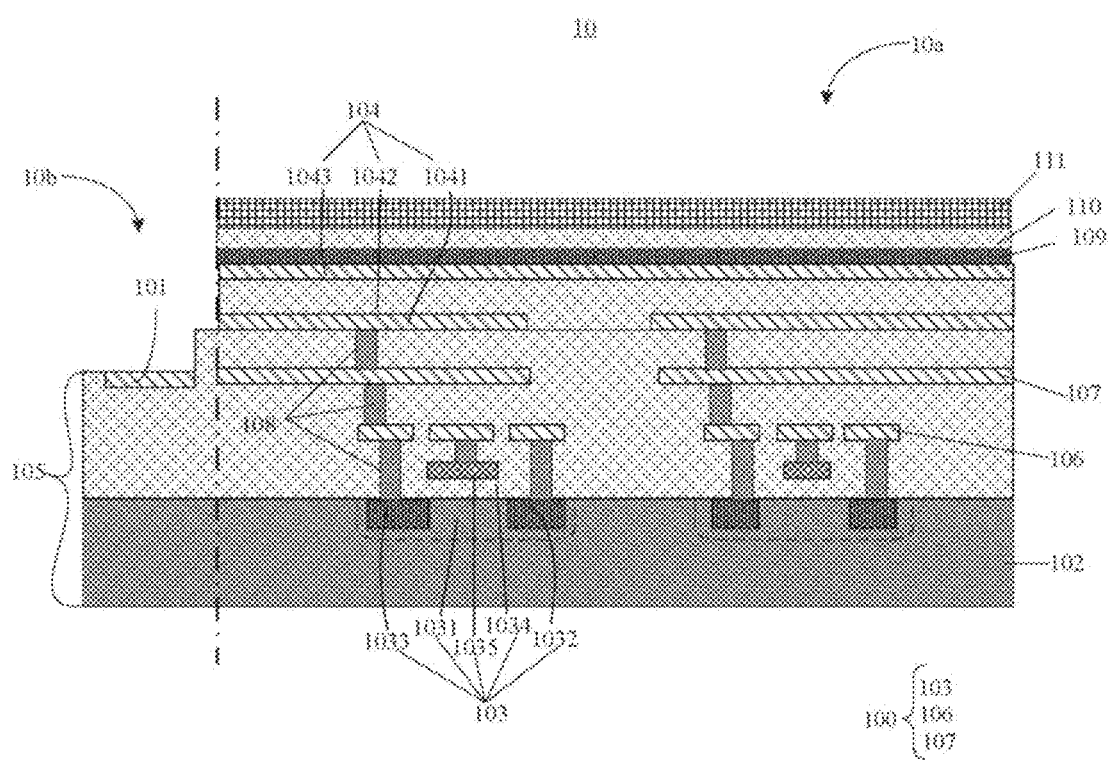
FIG. 4 is a schematic partial cross-sectional view of a display substrate shown in an embodiment of the present disclosure.

Specifically, as shown in FIGS. 3a, 3b and 4, the display substrate 10 has a display region 10a and a bonding region 10b located at at least one side of the display region 10a, and the bonding region 10b is provided with a first pad 101. The first pad 101 may be a single-layer or multi-layer structure, and the first pad 101 may be made of metal, alloy or other materials, for example: the first pad 101 may be made of a single-layer or multi-layer metal structure, such as copper, molybdenum, aluminum and titanium, etc., but not limited thereto, the first pad 101 may also be made of other conductive materials.

The first pad 101 is generally used for bonding with an external element (e.g., the flexible circuit board 20) after the device fabrication in the display region 10a is completed so as to provide signals, such as a power supply voltage signal, etc., for the display substrate 10. The first pad 101 may be disposed on the same layer as the conductive structure in the display region 10a so as to save processes. For example, as shown in FIG. 4, the first pad 101 may be disposed on the same layer as the conductive layer 107 located on the topmost layer (farthest from the base substrate) below the light-emitting element 104 in the display region 10a to facilitate the subsequent bonding process.

It should be noted that "disposed on the same layer" in the embodiment of the present disclosure means that a plurality of structures are formed from the same material film through the same or different patterning processes, and thus they are made of the same material.

In some embodiments, the thickness of the display substrate 10 may be 0.5 mm to 1 mm, such as: 0.5 mm, 0.75 mm, 0.1 mm, etc., but is not limited thereto, and the thickness of the display substrate 10 may also be other values depending on the circumstances. The width of the first pad 101 may be 60 μm to 80 μm, such as: 60 μm, 70 μm, 80 μm, etc., and the length of the first pad 101 may be 480 μm to 520 μm, such as: 480 μm, 500 μm, 520 μm, etc., but is not limited thereto, and the width and length of the first pad 101 may also be other values depending on the circumstances.

It should be noted that in some embodiments of the present disclosure, the thickness refers to the dimension in a first direction Z as shown in FIGS. 1a, 3a and 3b, the length refers to the dimension in a second direction X as shown in FIGS. 1b, 1c, 3a and 3b, and the width refers to the dimension in a third direction Y as shown in FIGS. 1b and 1c.

As shown in FIG. 3a, the flexible circuit board 20 includes a flexible substrate 201, a first wiring layer 202, and a first reinforcement plate 203; the first wiring layer 202 is formed on the flexible substrate 201, and the first wiring layer 202 may include a main wiring portion 202b and a second pad 202a, and the first reinforcement plate 203 is formed on one side of the first wiring layer 202 facing away from the flexible substrate 201.

In detail, the orthographic projection of the main wiring portion 202b on the flexible substrate 201 is located within the orthographic projection of the first reinforcement plate 203 on the flexible substrate 201, in other words, the orthographic projection of the first reinforcement plate 203 on the flexible substrate 201 covers the orthographic projection of the main wiring portion 202b on the flexible substrate 201; the first reinforcement plate 203 can protect the main wiring portion 202b on the flexible circuit board 20, in addition, it can ensure the structural stability of the flexible circuit board 20 and facilitate the overall assembly of the product.

The second pad 202a is electrically connected with the main wiring portion 202b and extends in a direction away from the main wiring portion 202b. The second pad 202a is used to be electrically connected with the first pad 101 in the display substrate 10, and specifically, it may be electrically connected by a conductive adhesive layer 3; since the second pad 202a needs to be electrically connected with the second pad 202a by the conductive adhesive layer 3, the orthogonal projection of the second pad 202a on the flexible substrate 201 does not overlap with the orthogonal projection of the first reinforcement plate 203 on the flexible substrate 201, that is, the second pad 202a is exposed relative to the first reinforcement plate 203 to realize the bonding between the second pad 202a and the first pad 101, so that the flexible circuit board 20 can be electrically connected with the display substrate 10.

It should be noted that the orthographic projection on the flexible substrate 201 mentioned in the embodiment of the present disclosure specifically refers to the orthographic projection on the central horizontal plane of the flexible substrate 201, and this central horizontal plane refers to the plane located at the center of the flexible substrate 201 when the flexible circuit board is horizontally placed without bending, and the central horizontal plane is a plane perpendicular to the first direction Z.

Furthermore, it should be understood that, as shown in FIG. 1b, a plurality of first pads 101 spaced apart in a third direction Y may be disposed on the bonding region 10b of the display substrate 10, and the third direction Y is perpendicular to the first direction Z. Each of the first pads 101 has a first side 101' and a second side 101" extending along the third direction Y, and the display substrate 10 has a third side 10' and a fourth side 10" extending along the third direction Y, the first pad 101 is closer to the third side 10', and the distance dl between the third side 10' of the display substrate 10 and the first side 101' of the first pad 101 is 50 μm to 70 μm, such as 50 μm, 60 μm and 70 μm, etc., but is not limited thereto, and the distance may be other values depending on the circumstances. The first wiring layer 202 of the flexible circuit board 20 may also have a plurality of second pads 202a spaced apart in a third direction Y. The length direction of the first pad 101 and the second pad 202a is a second direction X shown in FIGS. 1b and 1c; the second direction X is perpendicular to the third direction Y and the first direction Z; and each of the second pads 202a is correspondingly bound with one of the first pads 101.

For example, the flexible substrate 201 and the first reinforcement plate 203 in the flexible circuit board 20 may have a single-layer structure or a multi-layer structure; and the flexible substrate 201 and the first reinforcement plate 203 may be made of PI (polyimide) or other materials. The first wiring layer 202 may be made of Al (aluminum) or Cu (copper) or other materials. The conductive adhesive layer 3 may be an Anisotropic Conductive Film (ACF), which uses the conductive particles 30 to bind the second pad 202a of the flexible circuit board 20 and the first pad 101 of the display substrate 10, so as to enable the electrical conduction between the flexible circuit board 20 and the display substrate 10, and meanwhile, since the anisotropic conductive adhesive layer 3 is only conducted in the thickness direction of the flexible substrate 201, and the thickness direction of the flexible substrate 201 is the first direction Z shown in FIGS. 3a and 3b; therefore, the occurrence of conduction short circuit between the adjacent pads in the horizontal direction can be avoided, so as to ensure the stability of the electrical connection between the flexible circuit board 20 and the display substrate 10.

In addition, since the anisotropic conductive adhesive layer is only conducted in the thickness direction of the flexible substrate 201, the anisotropic conductive adhesive layer can be provided on the entire surface in the process of bonding a plurality of pairs of the first pad 101 and the second pad 202a, so as to reduce the bonding difficulty.

Since the first wiring layer 202 is usually made of Al (aluminum) or Cu (copper) or other materials, the part (for example, the second pad 202a) not covered by the first reinforcement plate 203 is susceptible to oxidation, and in order to ensure that the second pad 202a has good conductivity, an oxidation resistant membrane layer with good conductivity may be coated on the second pad 202a, for example, thin film made of gold (Au), etc. Since the second pad 202a is coated with the oxidation resistant membrane layer, the thickness of the second pad 202a is greater than that of the main wiring portion 202b, as shown in FIG. 3a.

In addition, as shown in FIG. 3b, the main wiring portion 202b and the second pad 202a may be connected by a transition portion 202c, and the transition portion 202c has the same structure as the second pad 202a, and it can be understood that the transition portion 202c and the second pad 202a are integrally formed. In order to avoid the part of the main wiring portion 202b connected with the second pad 202a from being oxidized, the first reinforcement plate 203 may cover the transition portion 202c in the process of fabricating the flexible circuit board 20, so as to ensure that the first reinforcement plate 203 can completely cover the main wiring portion 202b and avoid the main wiring portion 202b from being exposed.

Figure 2:
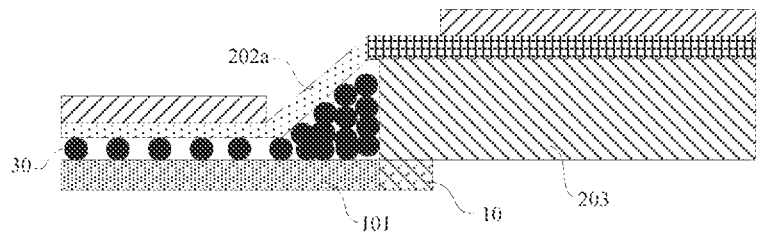
FIG. 2 is a schematic partial side view of a display shown in the related art.

It should be understood that, in order to ensure structural stability of the flexible circuit board 20, the thickness of the first reinforcement plate 203 may be greater than that of the second pad 202a. To do so, however, in the process of connecting the second pad 202a with the first pad 101, if the first reinforcement plate 203 is lapped to the edge of the display substrate 10, the part in the second pad 202a close to the first reinforcement plate 203 may be warped, as shown in FIG. 2, at this time, the contact area between the second pad 202a and the first pad 101 will be reduced, thus increasing the contact resistance between the second pad 202a and the first pad 101, so that the stability of the electrical connection between the flexible circuit board 20 and the display substrate 10 will be poor. In addition, since the first reinforcement plate 203 is lapped to the edge of the display substrate 10, the first reinforcement plate 203 can be used as a barricade, so that the conductive particles 30 of part of the conductive adhesive layer 3 cannot be smoothly discharged after being extruded, accumulating at a suspension position, thereby the reliability of the flexible circuit board 20 deteriorates.

Therefore, in order to avoid such a situation, in some embodiments, after the second pad 202a and the first pad 101 are electrically connected by the conductive adhesive layer 3, the first reinforcement plate 203 may be located outside the display substrate 10 in the extension direction of the second pad 202a, that is, the first reinforcement plate 203 is not lapped at the edge of the display substrate 10, which can prevent the second pad 202a from warping, so as to ensure the connection area between the second pad 202a and the first pad 101, and improve the bonding yield between the flexible circuit board 20 and the display substrate 10, thereby the connection stability between the flexible circuit board 20 and the display substrate 10 is ensured, and the display has good signal transmission performance.

In some embodiments, in the extension direction of the second pad 202a, which can also be understood that the second direction X shown in FIGS. 3a and 3b, the first reinforcement plate 203 should have a non-zero distance from the display substrate 10, that is, the edge of the first reinforcement plate 203 does not contact with the edge of the display substrate 10, so as to avoid the situation that the first reinforcement plate 203 blocks the conductive adhesive layer 3 from being discharged, that is, design like this can ensure that part of the conductive adhesive layer 3 can be discharged smoothly in extrusion and bonding process of the first pad 101 and the second pad 202a, so as to alleviate the accumulation of the conductive particles 30 in the conductive adhesive layer 3, and ensure that the conductive particles 30 can evenly distributed, thereby ensuring the reliability of the flexible circuit board 20.

Further, the distance H1 between the first reinforcement plate 203 and the display substrate 10 in the extension direction of the second pad 202a is not less than 200 µm, so as to avoid the accumulation of the conductive particles 30 in the conductive adhesive layer 3, thus further ensuring the reliability of the flexible circuit board 20.

In some embodiments, as shown in FIGS. 3a and 3b, the conductive adhesive 3 covers the first pad 101 and an edge area of the display substrate 10 close to the main wiring portion 202b.

Alternatively, the conductive adhesive layer 3 extends in a direction close to the main wiring portion 202b and protrudes out of a boundary of the display substrate 10, and the part of the conductive adhesive layer 3 protruding out of the boundary of the display substrate 10 is not less than 200 µm, that is, the distance H1 between the end face of the conductive adhesive layer 3 close to the main wiring portion 202b and the boundary of the display substrate is not less than 200 µm; so as to avoid the accumulation of the conductive particles 30 in the conductive adhesive layer 3, thus further ensuring the reliability of the flexible circuit board 20.

In some embodiments, the flexible circuit board 20 further includes a second reinforcement plate 204, and the second reinforcement plate 204 may be made of PI (polyimide) or other materials. The second reinforcement plate 204 is located on one side of the flexible substrate 201 away from the first wiring layer 202, the second reinforcement plate 204 has at least a first reinforcement region 204a, and the orthographic projection of the first reinforcement region 204a on the flexible substrate 201 overlaps with the orthographic projection of the second pad 202a on the flexible substrate 201, design like this can increase the structural strength of the region where the second pad 202a is disposed in the flexible circuit board 20.

The second reinforcement plate 204 may further have a second reinforcement region 204b, the second reinforcement region 204b and the first reinforcement region 204a are sequentially arranged and connected with each other in the extension direction of the second pad 202a, and the orthographic projection of the second reinforcement region 204b on the flexible substrate 201 is located within the orthographic projection of the first reinforcement plate 203 on the flexible substrate 201, that is, a part of the second reinforcement plate 204 may also extend to the region where the main wiring portion 202b is disposed in the flexible circuit board 20, so as to avoid stiffness abrupt change at the boundary between the region where the second pad 202a is located and the region where the main wiring portion 202b is located in the flexible circuit board 20, leading to the situation that the boundary is easily damaged in the process of laminating and bonding the second pad 202a and the first pad 101, that is, the problem that the second pad 202a and the joint between the second pad 202a and the main wiring portion 202b are easily broken is avoided, so as to ensure the structural stability of the flexible circuit board 20 in the bonding process.

It should be noted that the second reinforcement region 204b and the first reinforcement region 204a of the second reinforcement plate 204 may be integrally formed, so that the second reinforcement plate 204 is an integral structure, and the structural strength of the second reinforcement plate 204 is ensured.

Alternatively, the dimension H2 of the second reinforcement region 204b in the extension direction of the second pad 202a is not less than 500 μm, which can also be understood as the dimension H2 of the second reinforcement region 204b in the second direction X shown in FIGS. 3a and 3b is not less than 500 μm; it may also be understood that the length of the overlapping portion of the second reinforcement plate 204 and the first reinforcement plate 203 in the first direction Z is not less than 500 μm, so as to further prevent the problem that the second pad 202a and the joint between the second pad 202a and the main wiring portion 202b are easily broken, and ensure the structural stability of the flexible circuit board 20 in the bonding process.

In some embodiments, the flexible circuit board 20 may further include a second wiring layer 205 and a third reinforcement plate 206, the second wiring layer 205 is located on the side of the flexible substrate 201 away from the first wiring layer 202 and is electrically connected with the main wiring portion 202b through a via hole 207, and the second wiring layer 205 may be made of Al (aluminum) or Cu (copper) or other materials; the third reinforcement plate 206 is formed on the side of the second wiring layer 205 away from the flexible substrate 201, and the third reinforcement plate 206 may be made of PI (polyimide) or other materials. The orthographic projection of the second wiring layer 205 on the flexible substrate 201 is located within the orthographic projection of the first reinforcement plate 203 on the flexible substrate 201, and is located within the orthographic projection of the third reinforcement plate 206 on the flexible substrate 201. In the embodiment, the flexible circuit board 20 is provided with two wiring layers to facilitate wiring, and by providing the third reinforcement plate 206, on the one hand, the second wiring layer 205 can be protected, and on the other hand, the structural strength of the flexible circuit board 20 can be enhanced.

It should be understood that the flexible circuit board 20 may be provided with not only two wiring layers, but also more layers, for example: three layers, four layers, etc., it depends on the specific circumstances.

Alternatively, there may be a plurality of the via hole 207 for connecting the first wiring layer 202 and the second wiring layer 205, so as to ensure the connection stability between the first wiring layer 202 and the second wiring layer 205.

There is a fracture 208 between the third reinforcement plate 206 and the second reinforcement region 204b, that is, the second reinforcement plate 204 and the third reinforcement plate 206 are in a disconnected state, and there is a gap between the both in the second direction X. The flexible circuit board 20 in the embodiment may be bent at the fracture 208, so as to improve the bending capability of the flexible circuit board 20.

Alternatively, the third reinforcement plate 206 is also formed on one side of the second wiring layer 205 facing the second reinforcement region 204b to prevent the second wiring layer 205 from being exposed towards the side facing the second reinforcement region 204b, on the one hand, oxidation of the second wiring layer 205 can be avoided, thereby ensuring that the second wiring layer 205 has good conductivity; meanwhile, on the other hand, the second wiring layer 205 may mistakenly touch other conductive parts at the fracture 208 can be avoided.

In some embodiments, in the process of fabricating the second reinforcement plate 204 and the third reinforcement plate 206, an entire membrane layer may be fabricated on the side of the flexible substrate 201 away from the first circuit layer, and then the fracture 208 is cut or etched on the entire membrane layer to form the second reinforcement plate 204 and the third reinforcement plate 206 that are disconnected from each other, but is not limited thereto, the second reinforcement plate 204 and the third reinforcement plate 206 may also be formed separately, which depends on the specific circumstances.

In some embodiments, the overall thickness of the flexible circuit board 20 is smaller than the thickness of the display substrate 10; the thickness of the flexible circuit board is 0.1 mm to 0.2 mm, for example, 0.1 mm, 0.15 mm, 0.2 mm, etc., but is not limited thereto, the thickness of the flexible circuit board 20 may also be other values depending on the circumstances. The length of the second pad 202a in the flexible circuit board is greater than the length of the first pad 101 in the display substrate 10; the length of the second pad 202a is 1 mm to 1.5 mm, for example, 1 mm, 1.1 mm, 1.2 mm, 1.3 mm, 1.4 mm, 1.5 mm, etc.; the width of the second pad 202a may be greater than or equal to the width of the first pad 101, and the width of the second pad 202a may be 60 μm to 80 μm, for example, 60 μm, 70 μm, 80 μm, and the like; but is not limited thereto, the length and the width of the second pad 202a may also be other values depending on the circumstances; it should be understood that the orthographic projection of the second pad 202a on the display substrate 10 may completely cover the first pad 101 to ensure the bonding stability between the second pad 202a and the first pad 101.

In some embodiments, the length of the fracture 208 between the third reinforcement plate 206 and the second reinforcement region 204b of the second reinforcement plate 204 may be 7 mm to 9 mm, for example, 7 mm, 8 mm, 9 mm, etc., but is not limited thereto, the length of the fracture 208 can be determined according to the specific bending.

In some embodiments, as shown in FIG. 4, the display substrate 10 specifically includes a base substrate and a driving circuit 100.

The base substrate may be a silicon substrate 102, for example, the silicon substrate 102 is monocrystalline silicon or high purity silicon.

At least part of the driving circuit 100 is embedded in the base substrate so that it is formed as the driving substrate 105 as a whole. It should be understood that the driving circuit 100 may include a circuit structure located in the display region 10a and may also include a circuit structure located at the bonding region 10b. The driving circuit 100 may include a transistor with a semiconductor layer, the semiconductor layer is located inside the silicon substrate 102, and the transistor may not only be distributed in the display region 10a, but also in the bonding region 10b, or in other non-display regions.

The driving circuit 100 of the embodiment of the present disclosure may be electrically connected with the first pad 101 of the bonding region 10b, and the first pad 101 is bound with the second pad 202a of the flexible circuit board 20, so as to provide a signal, such as a power supply voltage signal, to the display substrate 10; that is, the driving circuit 100 may include a power supply voltage signal line (not shown), which can be electrically connected with the first pad 101, that is, the power supply voltage signal line may be electrically connected with a driving terminal through the first pad 101 and the flexible circuit board 20 to obtain a power supply voltage signal from the driving terminal.

Specifically, the driving circuit 100 may include a pixel circuit located in the display region 10a, and the pixel circuit may be formed on the silicon substrate 102 by a semiconductor process, for example, a semiconductor layer 1031 (i.e., an active layer), a source electrode 1032 and a drain electrode 1033 of the driving transistor 103 are formed on the silicon substrate 102 by a doping process, and an insulating layer 1034 is formed by a silicon oxidation process, and a gate electrode 1035 and a plurality of conductive layers 106, 107, etc. are formed by a sputtering process or other processes. The semiconductor layer 1031 of the driving transistor 103 is located inside the base substrate; that is, the semiconductor layer 1031 may belong to a part of the silicon substrate 102.

It is to be noted that the driving circuit 100 may further include a gate driving circuit, a data driving circuit, a data signal line, and a scan signal line, and the data driving circuit and the gate driving circuit are connected with the pixel circuit of the light-emitting element 104 through the data signal line and the scan signal line, respectively, so as to supply an electrical signal. The data driving circuit is used for providing a data signal, the gate driving circuit is used for providing a scan signal and can be further used for providing various control signals, power supply signals, etc.

In some embodiments, the gate driving circuit and the data driving circuit may also be integrated in the silicon substrate 102 by the above-mentioned semiconductor process. That is, in the case that the silicon substrate 102 is used as the base substrate in the display substrate 10, the pixel circuit, the gate driving circuit, and the data driving circuit can all be integrated on the silicon substrate 102. In this case, since the silicon-based circuit can achieve higher accuracy, the gate driving circuit and the data driving circuit may also be formed in a region corresponding to the display region 10a of the display substrate 10, for example, and not necessarily in the non-display region. The gate driving circuit and the data driving circuit may adopt conventional circuit structures in the art, and the embodiments of the present disclosure are not limited thereto.

In some embodiments, as shown in FIG. 4, the display substrate 10 may further include a light-emitting element 104, the light-emitting element 104 is formed on the side of the driving circuit away from the silicon substrate 102 and located in the display region 10a, and the light-emitting element 104 may be electrically connected with the driving circuit. In detail, the light-emitting element 104 may include an anode 1041, a light-emitting layer 1042 and a cathode 1043 which are sequentially formed on the driving substrate 105, and the anode 1041 may be electrically connected with the drain electrode 1033 in the driving transistor 103 through a contact hole 108 filled with a conductive material (e.g., metal tungsten, etc.) and a plurality of conductive layers 106 and 107; as shown in FIG. 4, one insulating layer 1034 and two conductive layers 106, 107 are shown, however, the number of insulating and conductive layers is not limited by the embodiments of the present disclosure.

There may be a plurality of light-emitting element 104, the anodes 1041 of the plurality of light-emitting elements 104 are disconnected from each other, and the cathodes 1043 of the plurality of light-emitting elements 104 may be provided in an entire layer. It should be noted that a spacing portion (PDL) may be provided between the adjacent anodes 1041, or the spacing portion (PDL) may not be provided, which depends on the specific circumstances.

In some embodiments, the topmost conductive layer 107 in the driving substrate 105 has a reflective property, such as a titanium/titanium nitride/aluminum laminated structure. For example, the conductive layer 107 includes a plurality of sub-layers spaced apart from each other, and they are disposed in one-to-one correspondence with the anodes 1041 of each light-emitting element 104. In the top emission structure, the conductive layer 107 may be provided as a reflective layer for reflecting light emitted from the light-emitting element 104, so as to improve the efficiency of light emitting. For example, the orthographic projection of the anode 1041 of each light-emitting element 104 on the silicon substrate 102 falls within the orthographic projection of its corresponding part of the conductive layer on the silicon substrate 102. In this case, the anode 1041 may employ a transparent conductive oxide material with a high work function, for example, indium tin oxide (ITO), indium zinc oxide (IZO), etc.

In some embodiments, the display substrate 10 further includes an encapsulating layer 109, a color filter layer 110, a cover plate 111, etc. on one side of the light-emitting element 104 away from the silicon substrate 102. For example, the first encapsulating layer 109 is configured to seal the light-emitting element 104 to prevent damage to the device due to permeation of moisture and oxygen from the outside to the light-emitting element 104 and the pixel circuit. For example, the first encapsulating layer 109 includes an inorganic thin film or a structure in which an organic thin film and an inorganic thin film are alternately stacked. The color filter layer 110 may comprise color blocks such as R (red), G (green), B (blue), etc. The cover plate 111 is, for example, a glass cover plate. The encapsulating layer 109 may also be disposed between the color filter layer 110 and the cover plate 111 to encapsulate the color filter layer 110.

In some embodiments, the display substrate 10 is an Organic Light-Emitting Diode (OLED) display substrate 10 or a Micro Organic Light-Emitting Diode (Micro OLED) display substrate 10.

An embodiment of the present disclosure further provides a display device, which includes the display described in any of the above embodiments.

According to the embodiments of the present disclosure, the specific type of the display device is not particularly limited, and may be any of commonly used display device type in the art, specifically, it may be, for example, a mobile device such as a display screen, a mobile phone, a laptop, etc., a wearable device such as a watch, etc., a VR device, etc., the type of the display device may be selected by those skilled in the art depending on particular application of the display device, which will not be repeated here.

It should be noted that in addition to the array substrate, the display device further includes other essential parts and components, and by taking a display device as an example, the display device further includes a housing, a main circuit board, a power line, or the like, those skilled in the art can make corresponding supplements according to the specific use requirements of the display device, which will not be repeated here. Those skilled in the art will readily recognize other embodiments of the present disclosure after considering the specification and practicing the contents disclosed herein. This application is intended to cover any variations, uses, or adaptations of the present disclosure which follow the general principles of the present disclosure and include any common knowledge or conventional technical means in the technical field not disclosed by the present disclosure. The specification and embodiments are to be regarded as illustrative only, with true scope and spirit of the present disclosure indicated by the claims.

What is claimed is:

1. A display, comprising:
a display substrate comprising a silicon substrate, a driving circuit, and a first pad, wherein at least part of the driving circuit is embedded in the silicon substrate, the driving circuit comprises a transistor with a semiconductor layer, the semiconductor layer is located inside the silicon substrate, and the first pad is electrically connected with the driving circuit;
a flexible circuit board comprising a flexible substrate, a first wiring layer, and a first reinforcement plate, wherein the first wiring layer is formed on the flexible substrate, the first wiring layer comprises a main wiring portion and a second pad, the second pad is electrically connected with the main wiring portion and is configured to extend in a direction away from the main wiring portion, and the second pad is electrically connected with the first pad by a conductive adhesive, wherein:
the first reinforcement plate is formed on a side of the first wiring layer away from the flexible substrate;
an orthographic projection of the first reinforcement plate on the flexible substrate is configured to cover an orthographic projection of the main wiring portion on the flexible substrate and do not overlap with an orthographic projection of the second pad on the flexible substrate;
in an extension direction of the second pad, the first reinforcement plate is located outside the display substrate and there is a non-zero distance between the first reinforcement plate and the display substrate;
a distance between the first reinforcement plate and the display substrate in the extension direction of the second pad is not less than 200 μm; and
the flexible circuit board further comprises a second reinforcement plate, the second reinforcement plate is located on a side of the flexible substrate away from the first wiring layer, the second reinforcement plate is configured to have at least a first reinforcement region, and an orthographic projection of the first reinforcement region on the flexible substrate is configured to overlap with the orthographic projection of the second pad on the flexible substrate.

2. The display according to claim 1, wherein the second reinforcement plate is further configured to have a second reinforcement region, the second reinforcement region and the first reinforcement region are sequentially arranged and connected with each other in the extension direction of the second pad, and an orthographic projection of the second reinforcement region on the flexible substrate is located within the orthographic projection of the first reinforcement plate on the flexible substrate.

3. The display according to claim 2, wherein a size of the second reinforcement region in the extension direction of the second pad is not less than 500 μm.

4. The display according to claim 2, wherein the first reinforcement region and the second reinforcement region are integrally formed.

5. The display according to claim 2, wherein:
the flexible circuit board further comprises a second wiring layer and a third reinforcement plate, the second wiring layer is located on the side of the flexible substrate away from the first wiring layer and is electrically connected with the main wiring portion through a via hole, and the third reinforcement plate is formed on a side of the second wiring layer away from the flexible substrate; and
an orthographic projection of the second wiring layer on the flexible substrate is located within the orthographic projection of the first reinforcement plate on the flexible substrate, and is located within an orthographic projection of the third reinforcement plate on the flexible substrate.

6. The display according to claim 5, wherein there are a plurality of via holes.

7. The display according to claim 5, wherein a fracture is provided between the third reinforcement plate and the second reinforcement region.

8. The display according to claim 7, wherein the third reinforcement plate is configured to cover one side of the second wiring layer facing the second reinforcement region.

9. The display according to claim 1, wherein the conductive adhesive layer is made from an anisotropic conductive adhesive.

10. The display according to claim 1, wherein:
the display substrate is configured to have a display region and a bonding region located at at least one side of the display region, and the first pad is located in the bonding region; and
the display substrate further comprises a light-emitting element located in the display region, and the light-emitting element is formed at a side of the driving circuit away from a base substrate and is electrically connected with the driving circuit.

11. The display according to claim 1, wherein the display is part of a display device.

12. The display device according to claim 11, wherein the distance between the first reinforcement plate and the display substrate of the display in the extension direction of the second pad is not less than 200 μm.

13. The display device according to claim 12, wherein the flexible circuit board of the display further comprises a second reinforcement plate, the second reinforcement plate is located on the side of the flexible substrate away from the first wiring layer, the second reinforcement plate has at least a first reinforcement region, and the orthographic projection of the first reinforcement region on the flexible substrate overlaps with the orthographic projection of the second pad on the flexible substrate.

14. A display, comprising:
a display substrate comprising a silicon substrate, a driving circuit, and a first pad, wherein at least part of the driving circuit is embedded in the silicon substrate, the driving circuit comprises a transistor with a semiconductor layer, the semiconductor layer is located inside the silicon substrate, and the first pad is electrically connected with the driving circuit;
a flexible circuit board comprising a flexible substrate and a first wiring layer formed on the flexible substrate, wherein the first wiring layer comprises a main wiring portion and a second pad, the second pad is electrically connected with the main wiring portion and is configured to extend in a direction away from the main wiring portion, and the second pad is electrically connected with the first pad by a conductive adhesive layer, wherein:
the conductive adhesive layer is configured to cover the first pad and the edge area of the display substrate close to the main wiring portion; and
the conductive adhesive layer is configured to extend in a direction close to the main wiring portion and protrude out of a boundary of the display substrate, and a size of a part of the conductive adhesive layer protruding out of the boundary of the display substrate is not less than 200 μm.

15. The display according to claim 14, wherein:
the flexible circuit board further comprises a first reinforcement plate and a second reinforcement plate;
the first reinforcement plate is formed on a side of the first wiring layer away from the flexible substrate, an orthographic projection of the first reinforcement plate on the flexible substrate is configured to cover an orthographic projection of the main wiring portion on the flexible substrate and do not overlap with a orthographic projection of the second pad on the flexible substrate;
the second reinforcement plate is located at a side of the flexible substrate away from the first wiring layer, the second reinforcement plate is configured to have a first reinforcement region and a second reinforcement region, and an orthographic projection of the first reinforcement region on the flexible substrate is configured to overlap with the orthographic projection of the second pad on the flexible substrate; and
the second reinforcement region and the first reinforcement region are sequentially arranged and connected with each other in an extension direction of the second pad, and an orthographic projection of the second reinforcement region on the flexible substrate is located within the orthographic projection of the first reinforcement plate on the flexible substrate.

16. The display according to claim 15, wherein a size of the second reinforcement region in the extension direction of the second pad is not less than 500 μm.

17. The display according to claim 14, wherein the display is part of a display device.

* * * * *